United States Patent [19]

Kozawa

[11] Patent Number: 5,272,108

[45] Date of Patent: Dec. 21, 1993

[54] METHOD OF MANUFACTURING GALLIUM NITRIDE SEMICONDUCTOR LIGHT-EMITTING DEVICE

[75] Inventor: Takahiro Kozawa, Owariasahi, Japan

[73] Assignees: Kabushiki Kaisha Toyota Chuo Kenkyusho; Toyoda Gosei Co., Ltd., both of Aichi, Japan

[21] Appl. No.: 841,799

[22] Filed: Feb. 26, 1992

[30] Foreign Application Priority Data

Feb. 27, 1991 [JP] Japan ................... 3-057884

[51] Int. Cl.$^5$ ............................. H01L 21/20
[52] U.S. Cl. ..................... 437/127; 437/954; 437/987; 148/DIG. 35; 148/DIG. 113
[58] Field of Search ........... 437/127, 987, 954; 148/DIG. 35, DIG. 113

[56] References Cited

U.S. PATENT DOCUMENTS

| | | |
|---|---|---|
| 4,396,929 | 8/1983 | Ohki et al. |
| 4,855,249 | 8/1989 | Akasaki et al. ............ 437/127 |
| 5,122,478 | 6/1992 | Uesugi ........................ 437/987 |

*Primary Examiner*—Olik Chaudhuri
*Assistant Examiner*—Ramamohan Rao Páladugu
*Attorney, Agent, or Firm*—Oblon, Spivak, McClelland, Maier & Neustadt

[57] ABSTRACT

A gallium nitride semiconductor light-emitting device comprising: a substrate of semiconductor or insulator; an N layer of n-type gallium nitride semiconductor ($Al \times Ga_{1-x}N : 0 \leq X \leq 1$); an I layer of semiinsulating gallium nitride semiconductor ($Al_xGa_{1-x}N : 0 \leq X \leq 1$); a first electrode formed on the I layer; a low-resistance region extending from the first electrode through the I layer at least to the N layer and formed by diffusion of the material of the first electrode; and a second electrode formed on the I layer isolatedly from the first electrode. This device is manufactured by: forming, on a substrate of semiconductor or insulator, at least an N layer of n-type gallium nitride semiconductor and an I layer of semiinsulating gallium nitride semiconductor one after another; forming a first electrode on the I layer; forming directly under the first electrode a low-resistance region, which leads to at least the N layer through the I layer, by heating; and forming, on the I layer, a second electrode isolatedly from the first electrode.

16 Claims, 7 Drawing Sheets

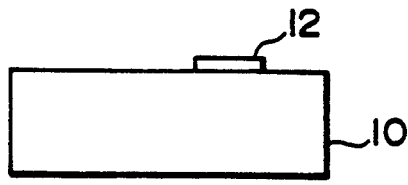
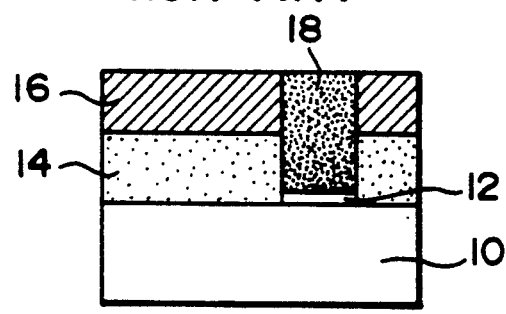
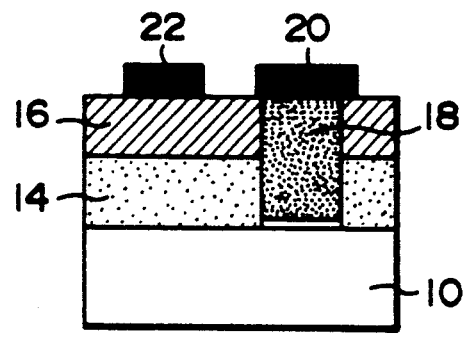

METHOD OF MANUFACTURING GALLIUM NITRIDE SEMICONDUCTOR LIGHT-EMITTING DEVICE

BACKGROUND OF THE INVENTION

1. Field of the Invention

This invention relates to a gallium nitride semiconductor light-emitting device for emitting blue light and short-wavelength-region light and a method of manufacturing the device.

2. Description of the Related Art

A gallium nitride semiconductor ($Al_xGa_{1-x}N:0 \leq X \leq 1$, hereinafter called "GaN") is currently regarded as a remarkable material for blue-light-emitting diodes and short-wavelength-region light-emitting devices.

Since a low-resistance p-type crystal cannot be obtained from GaN, an emitting diode using GaN has a so-called MIS-type structure consisting of a metal electrode (M layer), a semiinsulating GaN layer (I layer) and an N-type GaN layer (S layer). For developing such a light-emitting diode, it is essential to establish a technology of forming an electrode to be connected to an N-type GaN layer. Thus in a light-emitting device using a semiconductor of other III, V group compound such as $Al_xGa_{1-x}As$, the lower-layer electrode is formed on a conductive substrate; to the contrary, in the case of GaN, since sapphire of the substrate is insulating, it is impossible to form the electrode, which is to be connected to the N-type GaN layer, on this insulating substrate.

Since GaN is chemically very stable, it is impossible to partially remove the I-type GaN layer to expose the N-type GaN layer by chemically etching with chemicals and is also impossible to form an electrode on the exposed surface. Further when the electrode portion is provided on the side surface of the N-type GaN layer and wired with metal wires, the thickness of the N-type GaN layer can have only several μm to several tens μm so that the electrode would be poor in reliability and mass-productivity. To this end, following methods have heretofore been reported as technology of forming electrodes on the N-type GaN layer.

The first method is a method of forming a low-resistance region on a part of the GaN layer by treating the substrate with a kind of process. Specifically, as shown in FIGS. 5A through 5C of the accompanying drawings, when epitaxial growth of GaN is made after a bumpy region 12 having such as shallow grooves or scratches is formed on a part of a sapphire substrate 10 by a scriber or a dicer (FIG. 5A), an N-type low-resistance region 18 rather than an I-type layer will be formed (FIG. 5B) even if a large amount of zinc is doped to the GaN layer grown on the bumpy region 12. When an N-side electrode 20 is formed on the low-resistance region 18, a contact with an N-type GaN layer 14 can be made via an N-type low-resistance region 18 (FIG. 5C). Further an I-side electrode 22 is formed on an I-type GaN layer 16 isolatedly from the N-side electrode 20.

Also when epitaxial growth of GaN is made after dielectric films of $SiO_2$, $Al_2O_3$, $Si_3N_4$, etc. are heaped on a part of the sapphire substrate 10, likewise the case of forming of the bumpy region 12, an N-type low-resistance GaN layer will be formed on these films so that a contact with the N-type GaN layer can be made by forming an N-side electrode on the N-type low-resistance GaN layer.

The second method is a method of removing an I-type GaN layer such as by dry etching. Specifically, as shown in FIGS. 6A through 6C, an opening 28 is formed after an $SiO_2$ film 24 is heaped on the I-type GaN layer 16 (FIG. 6A), then the I-type GaN layer 16 directly under the opening 28 is removed by dry etching using a gas such as of $CCl_4$ or $CCl_2F_2$ to expose the N-type GaN layer 14 to thereby form a contact hole 26 (FIG. 6B) so that a contact with the N-type GaN layer 14 can be made if an N-side electrode 20 is formed at the contact hole 26.

Likewise, an opening is formed after an $SiO_2$ film is heaped on the I-type GaN Layer, and a heating process is performed in a mixed gas atmosphere containing hydrogen chloride and argon in a hydrogen atmosphere at a mixture ratio of 3:1 so that the I-type GaN layer of the exposed surface is discomposed and removed to expose the N-type GaN layer, where an N-side electrode can be formed.

In another method, the I-type GaN layer is mechanically removed by scribing using a diamond needle, and then an N-side electrode is formed there.

However, in the first method, since the N-type low-resistance region 18 is formed by utilizing that GaN grown at the bumpy region 12 on the surface of the substrate 10 will be a polycrystal, it is difficult to control the carrier concentration accurately with good reproducibility. Further since the low-resistance region 18 is formed so as to extend from the surface of the I-type GaN layer 16 to the sapphire substrate 10, it is impossible to set the depth to a desired value. This method is a method that was invented in the manufacture of a GaN crystal by Ga—HCl—$NH_3$ hydride vapor phase epitaxy (HVPE) previously in use, and cannot be simply used in the production of a crystal by metal organic vapor phase epitaxy (MOVPE) now in use. Particularly by MOVPE process, it is impossible to grow a polycrystalline GaN layer uniformly on a dielectric film such as of $SiO_2$ or $Al_2O_3$ so that a low-resistance region cannot be formed.

The second method requires a multi-step complex process for forming an $SiO_2$ layer as a mask and its pattern, and dry etching or heating, and for forming an electrode. In the method in which an I-type GaN layer is scribed, the GaN layer would be encountered with a stress to cause a crack, which would be a cause for yield reduction, such as deterioration of electrical characteristics, in the actual device manufacturing.

SUMMARY OF THE INVENTION

It is therefore an object of this invention to provide a GaN light-emitting device which can be manufactured, without treating a substrate with any mechanical process or forming any contact hole, securing excellent reliability and mass-productivity.

Another object of the invention is to provide a method of manufacturing a GaN light-emitting device with excellent reliability and mass-productivity, without treating a substrate with any mechanical process or any complex step such as of forming a contact hole.

According to a first aspect of the invention, there is provided a gallium nitride semiconductor light-emitting device comprising: a substrate of semi-conductor or insulator; an N layer of N-type gallium nitride semiconductor ($Al_xGa_{1-x}N:0 \leq X \leq 1$); an I layer of semiinsulating gallium nitride semiconductor ($Al_x$-

$Ga_{1-x}N:0 \leq X \leq 1$); a first electrode formed on the I layer; a low-resistance region extending from the first electrode through the I layer at least to the N layer and formed by diffusion of the material of the first electrode; and a second electrode formed on the I layer isolatedly from the first electrode.

In this semiconductor light-emitting device, directly under the first or N-side electrode, the N-type low-resistance region is formed so as to extend through the I-type GaN layer (I layer) to the N-type GaN layer (N layer). A contact with the N-type GaN layer is made through the N-type low-resistance region. This N-type low-resistance region is formed by diffusing the material of the N-side electrode into the GaN layer by a special heating process. The depth of the N-type low-resistance region should be larger than the thickness of the I layer and may extend to the sapphire substrate.

The N-side electrode may comprise a single substance of nickel, for example, and is preferably a double-layer structure consisting of a first film of titanium (Ti) or chromium (Cr) and a second film of Ni or a nickel alloy. Generally in the case of the single-layer Ni electrode, it cannot be in tight contact with the GaN layer. Consequently it is possible to improve the tightness of contact between the Ni layer and the GaN layer by forming the electrode via a film of Ti or Cr, also securing a good ohmic characteristic after heating.

Since the electrode extends from the N layer via the N-type low-resistance region formed directly under the N-side electrode, it is possible to reduce the electrical resistance component of the light-emitting device, thus obtaining a good ohmic characteristic between the N-side electrode and the N layer. The depth of the low-resistance region should be larger than the thickness of the I layer and may be set within this range as desired.

According to a second aspect of the invention, there is provided a method of manufacturing a gallium nitride semiconductor light-emitting device, comprising: a first step of forming, on a substrate of semiconductor or insulator, at least an N layer of N-type gallium nitride semiconductor and an I layer of semi-insulating gallium nitride semiconductor one over another; a second step of forming a first electrode on a surface of the I layer; a third step of forming directly under the first electrode a low-resistance region, which leads to at least the N layer through the I layer, by heating; and a fourth step of forming, on the surface of the I layer, a second electrode isolatedly from the first electrode.

In other words, in the first step, at least the N layer and the I layer are formed one over another on a sapphire substrate such as by vapor deposition.

In the second step, the N-side electrode is formed on the I layer by a process, such as mask evaporation or photoetching, which is well known in semiconductor engineering.

In the third step, the SiO$_2$ layer as a protective film is heaped by evaporation and then heating is performed to cause a mutual action between the N-side electrode and the GaN layer so that the material of the N-side electrode is diffused to the GaN layer to form the N-type low-resistance region. At that time, the temperature of this heating is preferably 700° to 1000° C. and more preferably 800° to 900° C. If the heating temperature exceeds 1000° C., the whole I layer would be degenerated due to heat. If it is below 700° C., no good N-type low-resistance region can be formed. This heating process is performed while applying a nitrogen gas or a hydrogen gas. The heating time is preferably 15 seconds to 1 minute. In order to control the diffusion of impurity dopant and the thermal damage of the GaN layer, the heating unit is preferably a type having an infrared ray lamp which can be either heated or cooled quickly.

In the fourth step, the SiO$_2$ layer is removed, and then the I-side electrode is formed such as by evaporation. The resulting wafer is cut into chips of predetermined dimensions such as by a dicer. As a result, the light-emitting device has been manufactured.

This method is to form the N-type low-resistance region by diffusing the material of the N-side electrode to the GaN layer and would cause the following results:

1. Since the N-type low-resistance region is formed directly under the N-side electrode, the N-side electrode portion and the N-type low-resistance region would be located necessarily in the same position so that it is unnecessary to align the low-resistance region or the contact hole with the N-side electrode, which was needed in the conventional art.

2. The N-type low-resistance region of this invention, unlike the case in which the N-type low-resistance region is formed simultaneously with growth of the GaN layer after the sapphire substrate is processed (the above-mentioned first method of the conventional art), is formed by heating after the N-side electrode is formed. It is therefore possible to control the carrier concentration of the low-resistance region accurately with good reproducibility by adjusting the heating time and temperature independently of the growing condition of the GaN layer so that the electrical resistance component of the light-emitting device tends to be reduced and unevenness of characteristics between devices is also reduced.

In the first method of the conventional art, the N-type low resistance region extends from the surface of the I-type GaN layer to the sapphire substrate. In the method of this invention, it is possible to control the depth of the low-resistance region to set it to a desired value under the heating condition. Therefore it is possible to form the low-resistance region to a desired depth to extend through the I layer.

3. In the case in which a contact hole is formed (the above-mentioned second method of the conventional art), it requires many steps and time for forming the SiO$_2$ layer to be used as an etching mask and for dry etching. According to the method of this invention, it needs simple steps taking only a relatively short time so that a device which is good in yield can be manufactured inexpensively.

BRIEF DESCRIPTION OF THE DRAWINGS

FIGS. 5A through 5C are schematic cross-sectional views showing a typical process for manufacturing a conventional gallium nitride semiconductor device.

DETAILED DESCRIPTION

One embodiment of this invention will now be described with reference to the accompanying drawings. This invention should by no means be limited to the following embodiment.

Figure 1:
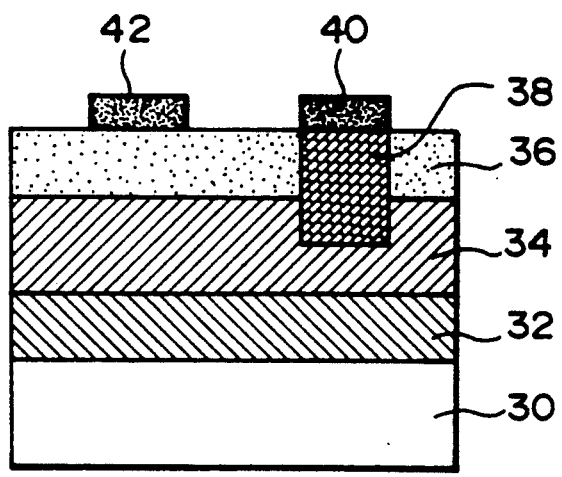
FIG. 1 is a schematic cross-sectional view showing a typical light-emitting diode to which a gallium nitride semiconductor light-emitting device of this invention is adopted.

FIG. 1 shows a light-emitting diode to which a gallium nitride semiconductor light-emitting device is adopted.

As shown in FIG. 1, the light-emitting diode has a sapphire substrate 30 on which an AlN buffer layer 32 having a thickness of about 500 angstroms is formed. On the upper surface of the buffer layer 32, an N-type GaN layer (hereinafter called "N layer") 34 having a thickness of about 2.5 μm is formed. Further on the upper surface of the N layer 34, a semiinsulating GaN layer (hereinafter called "I layer") 36 having a thickness of about 0.2 μm is formed. On the upper surface of the I layer 36, an I-side electrode 42 of metal connected to the I layer 36 and an N-side electrode 40 of metal connected to the N layer 34 are formed isolatedly from each other. Directly under the N-side electrode 40, an N-type low-resistance region 38 is formed, extending to the N layer 34 through the I layer 36.

The manner in which the light-emitting diode is manufactured will now be described with reference to FIG. 2.

The light-emitting diode is manufactured by MOVPE.

Firstly a monocrystalline sapphire substrate 30 cleaned by organic cleaning and heating is held by a susceptor placed in a reaction chamber of an MOVPE apparatus. Then the sapphire substrate 30 is etched in vapor at 1200° C. for 10 minutes while hydrogen gas is introduced into the chamber.

Figure 2A:
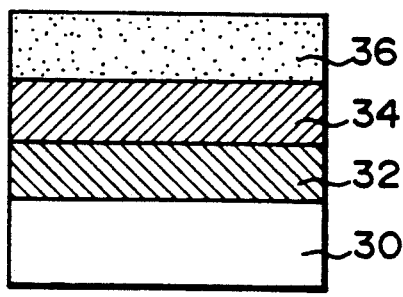
FIGS. 2A through 2F are schematic cross-sectional views showing the manufacturing process of the light-emitting diode of FIG. 1.

Then an AlN buffer layer 32 is formed so as to have a thickness of about 500 angstroms. Subsequently an N layer 34 in the form of an N-type GaN film having a thickness of about 2.5 μm and an I layer 36 in the form of a semiinsulating GaN film having a thickness of about 0.2 μm are formed one over another. Thus a multilayer LED wafer such as shown in FIG. 2A has been obtained (the first step).

Figure 2B:
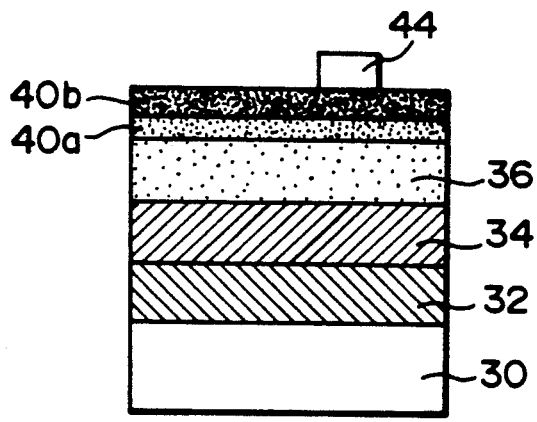
Figure 2C:
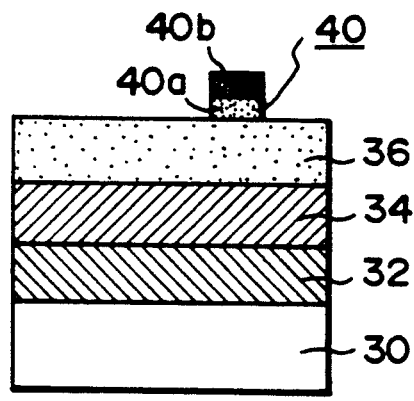

Then, as shown in FIG. 2B, on the entire upper surface of the I layer 36, a Ti electrode layer 40a and a Ni electrode layer 40b are formed one over another by evaporation so as to have a thickness of about 100 angstroms and a thickness of about 3000 angstroms, respectively. A photoresist 44 is applied to the upper surface of the Ni electrode layer 40b and is patterned in a predetermined shape by photolithography so as to remain at a portion where the electrode to be connected to the N layer 34 is to be formed. Then, as shown in FIG. 2C, the photoresist 44 is masked, and the exposed portions of the Ti electrode layer 40a and the Ni electrode layer 40b are etched, whereupon the photoresist 44 is removed. Thus an N-side electrode 40 has been formed (the second step).

Figure 2D:
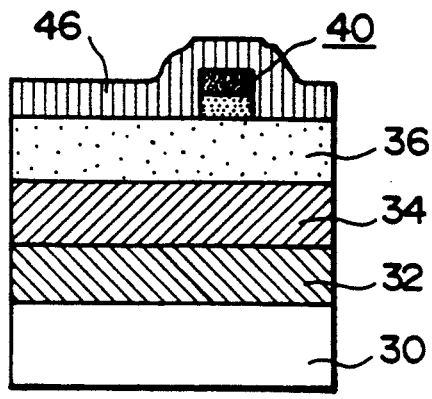
Figure 2E:
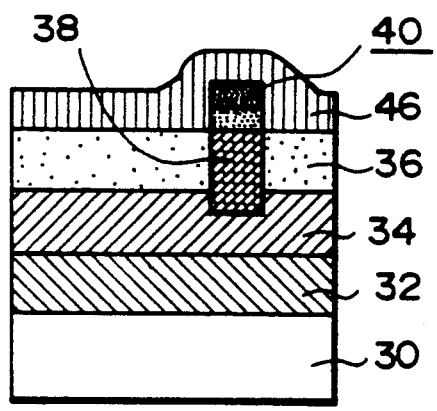

Then, as shown in FIG. 2D, on the entire upper surface of each of the I layer 36 and the N-side electrode 40, an SiO$_2$ layer 46 is formed so as to have a thickness of about 1000 angstroms by evaporation. The resulting sample is heated in nitrogen gas such as by an infrared ray lamp, and after the temperature reaches 900° C., it is kept for 20 to 50 seconds, whereupon the sample is cooled. Thus, as shown in FIG. 2E, an N-type low-resistance region 38 has been formed in the GaN layer (the third step).

Figure 2F:
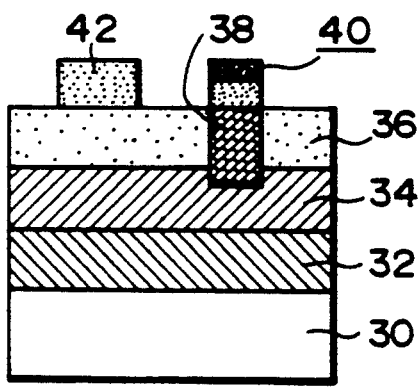

A photoresist is applied to the upper surface of the SiO$_2$ layer 46 and is patterned in a predetermined shape by photolithography so as to remain at portions other than the electrode portion to be connected to the I layer 36. Subsequently, on the entire upper surface of the sample, an Al layer is formed by evaporation, and the sample is soaked in an SiO$_2$ separation solution to remove the SiO$_2$ layer 46 so that the photoresist and the Al layer both formed directly on the SiO$_2$ layer 46 are removed. Thus, as shown in FIG. 2F, an I-side electrode 42 connected to the I layer 36 has been formed (the fourth step).

As mentioned above, it is possible to manufacture a gallium nitride semiconductor light-emitting device of MIS (Metal-Insulator-Semiconductor) type structure shown in FIG. 1.

In the third step of the manufacturing process, the N-type low-resistance region 38 is formed by facilitating diffusion between the N-side electrode 40 and the GaN layer by heating. To confirm this, following analysis tests were conducted.

Figure 3:
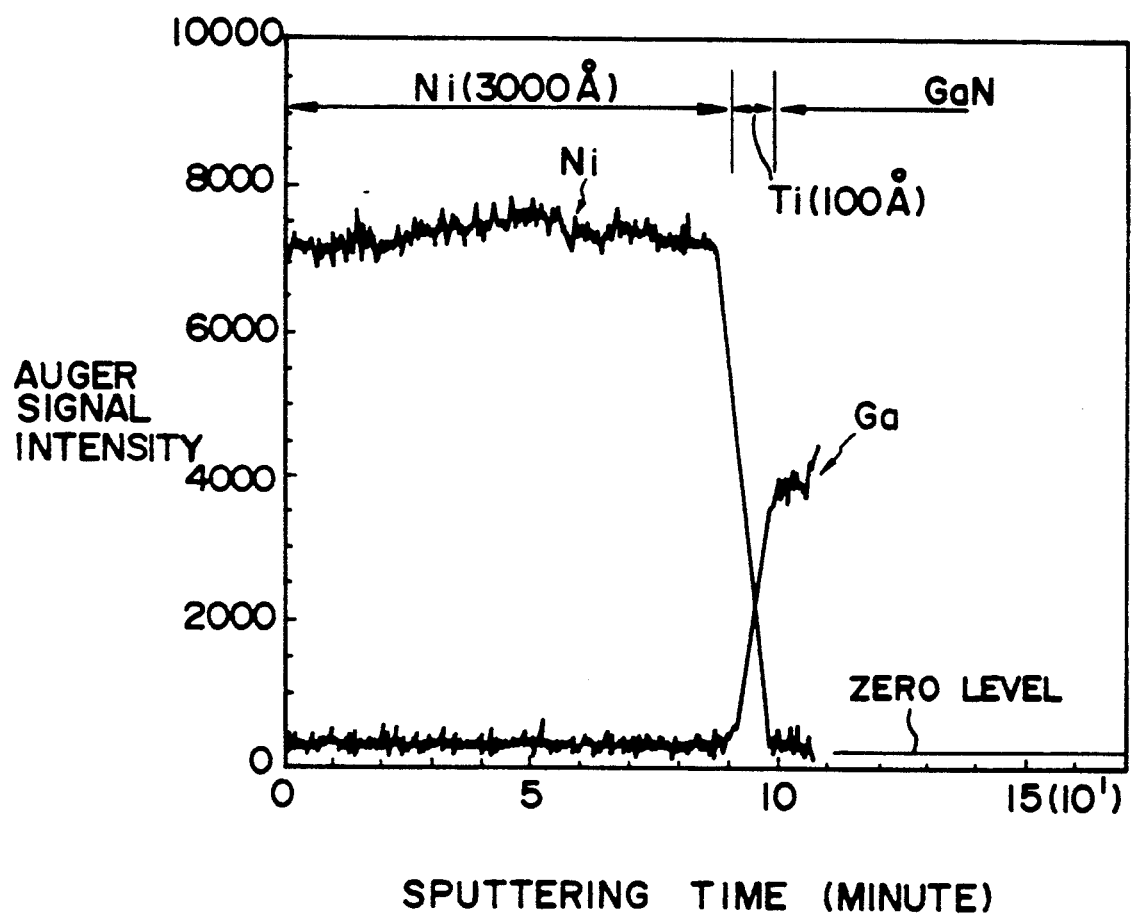
FIG. 3 shows the result of auger electron spectral analysis, before heating, for confirming whether a low-resistance region has been formed.
Figure 4:
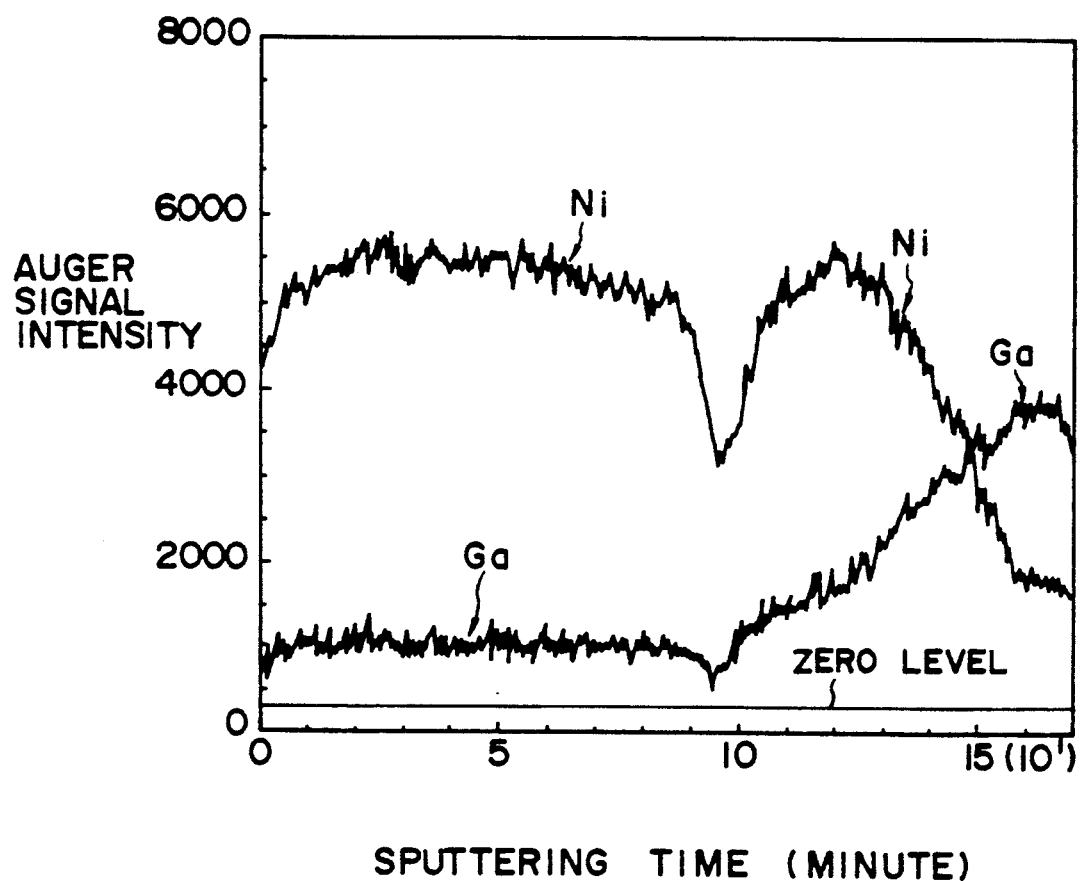
FIG. 4 shows the result of auger electron spectral analysis, after heating, for confirming whether a low-resistance region has been formed.
Figure 6A:
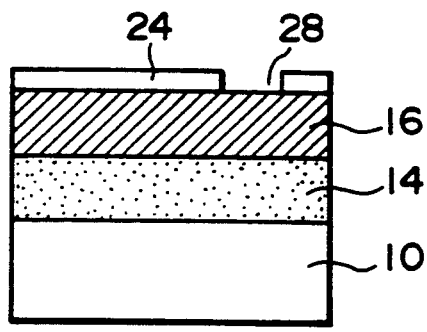
FIGS. 6A through 6C are schematic cross-sectional views showing a typical process for manufacturing another conventional gallium nitride semiconductor device.
Figure 6B:
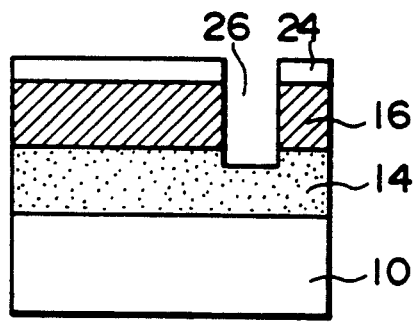
Figure 6C:
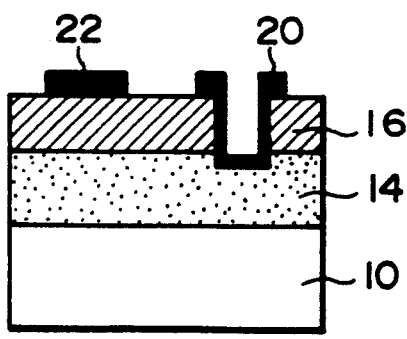

FIGS. 3 and 4 shows the results of observation, by auger electron spectral analysis, of change of composition of a sample, i.e. the N-side electrode 40, depthwise before and after heating. In the analysis results of FIGS. 3 and 4, for a better understanding, the characteristic curves of Ti, O and Ti+N are omitted, and only the characteristic curves of Ni and Ga are illustrated.

From comparison between the analysis results of FIGS. 3 and 4, it is understood that Ni penetrated into the GaN layer after heating, that Ga penetrated into the Ni layer after heating, and that the N-type low-resistance region was formed by mutual diffusion between the material of the N-side electrode 40 and GaN layer.

It was confirmed in the current-voltage characteristic of the light-emitting diode (FIG. 1) manufactured by the above-mentioned method, a building-up voltage was 6 V. which was about ½ compared to that in the conventional structure, thus reducing the driving voltage.

In this embodiment, the N-side electrode 40 is a double-layer structure consisting of a Ti layer and a Ni layer. Alternatively, the N-side electrode 40 may be a double-layer structure consisting of a Cr layer and a Ni layer, or a single-layer structure consisting of only a Ni layer.

The thickness of each of various layers of the light-emitting device of this invention may be changed according to device designing and is usually as follows. The sapphire substrate has a thickness of 100 to 1000 μm; the buffer layer, 50 angstroms to 2 μm; the N layer, 0.5 to 10 μm; and the I layer 0.01 to 1 μm. In an alternative form, the N layer or the I layer may not have a single-layer structure, and the N layer may have a double-layer structure having a low-carrier-concentration N layer and a high-carrier-concentration N+ layer in order from the joint of the N and I layers, and the I layer may have a double-layer structure having a low-impurity-concentration I$_L$ layer, which is relatively low in p-type impurity concentration, and a high-impurity-concentration I$_H$ layer, which is relatively high in p-type impurity concentration in order from the joint of the I and N layers. With this multilayer structure, it is possible to increase the blue light emitting intensity of the light-emitting diode, compared to the simple I-N connection.

What is claimed is:

1. A method of manufacturing a gallium nitride semiconductor light-emitting device, comprising:
   (a) a first step of forming, on a substrate of semiconductor or insulator, at least an N layer of n-type gallium nitride semiconductor and an I layer of semiinsulating gallium nitride semiconductor one after another;
   (b) a second step of forming a first electrode on a surface of said I layer;
   (c) a third step of forming directly under said first electrode a low-resistance region, which leads to at least said N layer through said I layer, by heating; and
   (d) a fourth step of forming, on the surface of said I layer, a second electrode isolated from said first electrode.

2. A method according to claim 1, wherein said first step comprises forming a buffer layer on said substrate and then forming said N layer on said buffer layer.

3. A method according to claim 2, wherein said buffer layer comprises aluminum nitride.

4. A method according to claim 1, wherein said forming in said first step is performed by metal organic vapor phase epitaxy.

5. A method according to claim 1, wherein said heating in said third step is conducted at a temperature of 700° to 1000° C.

6. A method according to claim 1, wherein said heating in said third step is conducted for 15 seconds to 1 minute.

7. A method according to claim 1, wherein said heating in said third step is conducted in the atmosphere of nitrogen gas or hydrogen gas.

8. A method according to claim 1, wherein said second electrode formed isolatedly from said first electrode contacts only said I layer, not said N layer.

9. The method according to claim 1, wherein said electrode has a double layer structure.

10. The method according to claim 9, wherein said first double layer structure consists of a first layer of titanium and a second layer of nickel.

11. A method according to claim 9, wherein said double layer structure consists of a first layer of chromium and a second layer of nickel.

12. A method according to claim 1, wherein said heating in said third step is conducted at a temperature of 800°–900° C.

13. A method according to claim 12, wherein said heating in said third step is conducted for from 15 seconds to 1 minute in an atmosphere of nitrogen gas or hydrogen gas.

14. A method according to claim 1, wherein said I layer surface and said first electrode are first coated with a layer of $SiO_2$ prior to forming said low-resistance region by heating.

15. A method according to claim 13, wherein said I layer surface and said first electrode are first coated with a layer of $SiO_2$ prior to forming said low-resistance region by heating.

16. A method according to claim 1, wherein the material constituting said first electrode diffuses into said I layer and said N layer so as to form the low-resistance region.

* * * * *

UNITED STATES PATENT AND TRADEMARK OFFICE
CERTIFICATE OF CORRECTION

PATENT NO. : 5,272,108
DATED : December 21, 1993
INVENTOR(S) : Takahiro Kozawa

It is certified that error appears in the above-indentified patent and that said Letters Patent is hereby corrected as shown below:

Column 8, Claim 9, line 8, before "electrode", insert --first--;
       Claim 10, line 10, delete "first" (first occurrence).

Signed and Sealed this

Fifth Day of July, 1994

*Attest:*

BRUCE LEHMAN

*Attesting Officer*     Commissioner of Patents and Trademarks